(12) United States Patent
Chambers

(10) Patent No.: US 9,128,684 B2
(45) Date of Patent: Sep. 8, 2015

(54) TABLET CASE

(71) Applicant: Dow AgroSciences LLC, Indianapolis, IN (US)

(72) Inventor: Doyle Michael Chambers, Indianapolis, IN (US)

(73) Assignee: Dow AgroSciences LLC, Indianapolis, IN (US)

( * ) Notice: Subject to any disclaimer, the term of this patent is extended or adjusted under 35 U.S.C. 154(b) by 0 days.

(21) Appl. No.: 13/797,043

(22) Filed: Mar. 12, 2013

(65) Prior Publication Data

US 2014/0131244 A1 May 15, 2014

Related U.S. Application Data

(60) Provisional application No. 61/726,142, filed on Nov. 14, 2012.

(51) Int. Cl.
| | |
|---|---|
| G06F 1/20 | (2006.01) |
| G06F 1/16 | (2006.01) |
| H05K 7/20 | (2006.01) |
| A45C 11/00 | (2006.01) |
| F25D 3/08 | (2006.01) |

(52) U.S. Cl.
CPC .............. *G06F 1/203* (2013.01); *G06F 1/1628* (2013.01); *G06F 1/1632* (2013.01); *A45C 2011/002* (2013.01); *A45C 2011/003* (2013.01); *F25D 3/08* (2013.01); *F25D 2303/084* (2013.01); *G06F 2200/1633* (2013.01); *H05K 7/2039* (2013.01); *H05K 7/20509* (2013.01)

(58) Field of Classification Search
CPC ......... G06F 1/20; G06F 1/203; H05K 7/2039; H05K 5/03
USPC ............... 361/679.46, 679.54, 688, 699, 700, 361/704, 709, 711; 312/236, 223.1–223.4; 206/320, 521
See application file for complete search history.

(56) References Cited

U.S. PATENT DOCUMENTS

| | | | |
|---|---|---|---|
| 3,095,291 A * | 6/1963 | Robbins ............................ 62/4 |
| 7,522,411 B2 * | 4/2009 | Haglund ................. 361/679.46 |
| 8,047,364 B2 * | 11/2011 | Longinotti-Buitoni ....... 206/320 |
| 8,089,753 B2 | 1/2012 | Dotson |
| 2009/0288925 A1 * | 11/2009 | Hess et al. ..................... 190/107 |
| 2010/0006614 A1 * | 1/2010 | McLean et al. ............... 224/577 |

FOREIGN PATENT DOCUMENTS

| | | |
|---|---|---|
| JP | 2003-337637 A | 11/2003 |
| KR | 1020110084368 | 8/2011 |

OTHER PUBLICATIONS

Sande, Nov. 12, 2011, http://www.tuaw.com/2011/11/12/gumdrop-drop-tech-series-cases-offer-serious-iphone-ipad-prote.*

* cited by examiner

*Primary Examiner* — Anthony Stashick
*Assistant Examiner* — Mollie Llewellyn
(74) *Attorney, Agent, or Firm* — C. W. Arnett; Faegre Baker Daniels LLP

(57) ABSTRACT

A case for an electronic device is provided including a sleeve sized and shaped to engage a housing of an electronic device, a bracket sized and shaped to engage the housing of the electronic device and to engage the sleeve; and a thermal pad sized and shaped to fit within the sleeve such that the thermal pad is held in contact with the electronic device when the electronic device is held within the sleeve.

16 Claims, 4 Drawing Sheets

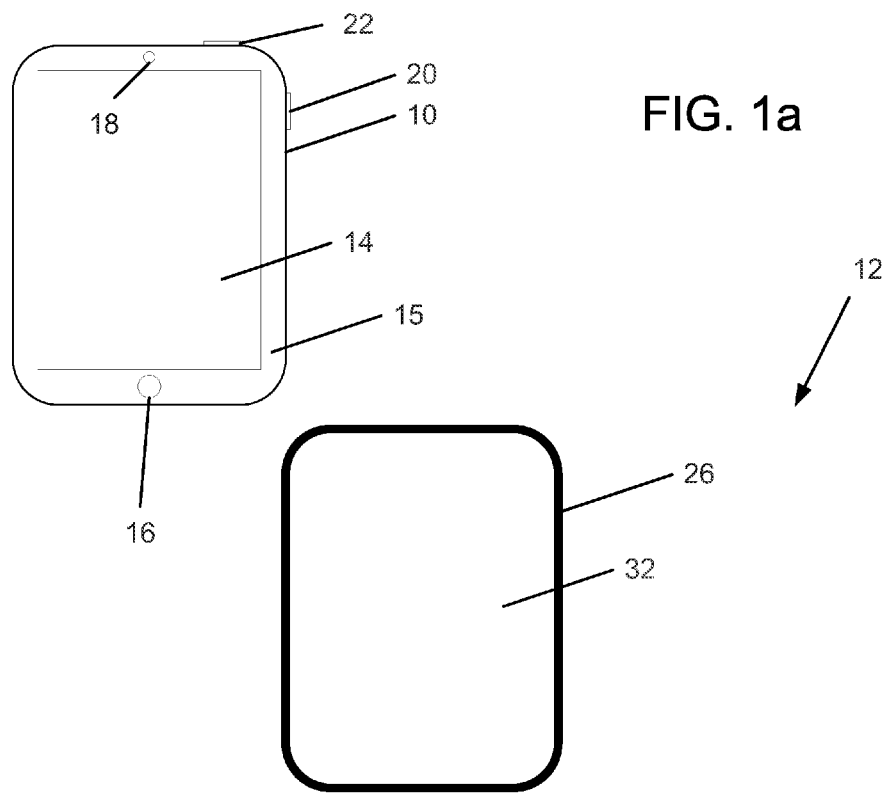
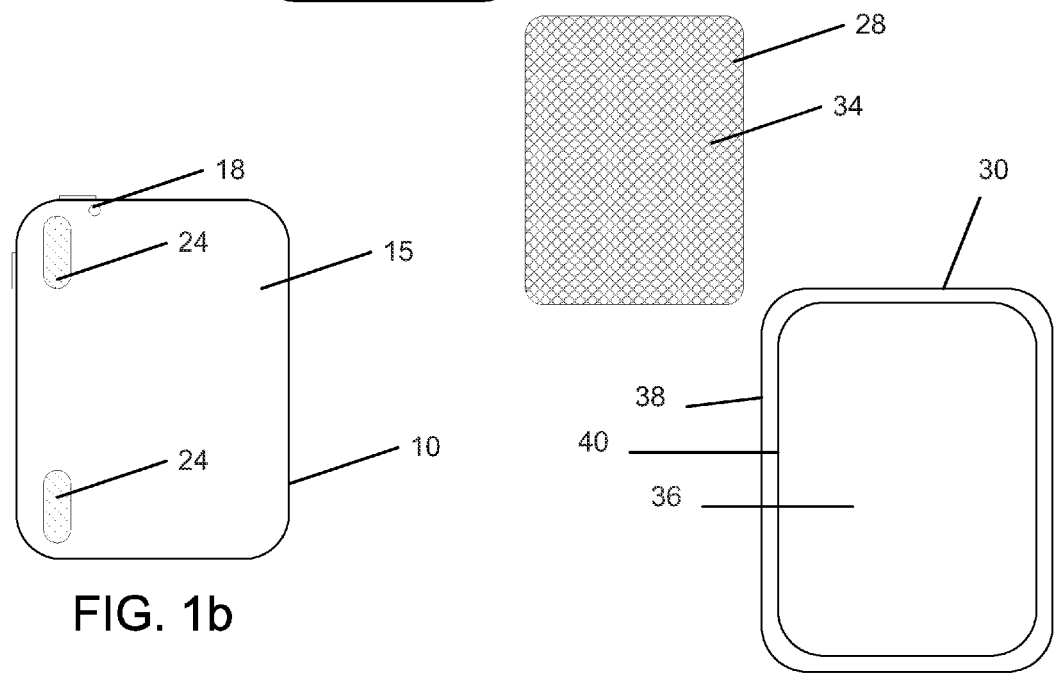
FIG. 1a
FIG. 1b

TABLET CASE

PRIORITY

The present application is a non-provisional application that claims priority to U.S. Provisional Patent Application No. 61/726,142, titled TABLET CASE, filed Nov. 14, 2012, the disclosure of which is explicitly incorporated herein.

FIELD

The present disclosure relates to a case for a tablet computing device, and more particularly to a case providing thermal, contaminant, and shock protection.

BACKGROUND AND SUMMARY

Tablet computing devices are relatively compact computing devices that often include a touchscreen. Tablets, such as those marketed under the name iPad by Apple, are manufactured without cooling fans. Tablets also have openings in their housings for facilitating sound production or otherwise. Part of the appeal of the tablet platform is its portability. Such portability produces an increased likelihood, relative to desktop and even laptop computing devices, of experiencing shocking movements, such as that experienced due to dropping the tablet. The portability also increases the likelihood, relative to traditional computing devices, that the tablet computing device will be transported into environments where heat management and foreign particle intrusion are of greater concern.

According to an exemplary embodiment of the present disclosure, a case for an electronic device is provided including a sleeve sized and shaped to engage a housing of an electronic device, a bracket sized and shaped to engage the housing of the electronic device and to engage the sleeve; and a thermal pad sized and shaped to fit within the sleeve such that the thermal pad is held in contact with the electronic device when the electronic device is held within the sleeve.

According to another exemplary embodiment of the present disclosure, a case for an electronic device is provided including a bracket sized and shaped to engage a housing of the electronic device, the bracket covering perimeter edges thereof; a silicone containing sleeve sized and shaped to engage the housing of an electronic device, the sleeve including a rim operable to sealingly engage one or more of the electronic device and the bracket, the sleeve having a pocket that is formed by molding or elastically deforming material of the sleeve; and a thermal pad sized and shaped to fit within the pocket of the sleeve such that the thermal pad is held in contact with the electronic device.

BRIEF DESCRIPTION OF THE DRAWINGS

The above-mentioned and other features of the disclosure, and the manner of attaining them, will become more apparent and the disclosure itself will be better understood by reference to the following description taken in conjunction with the accompanying drawings, wherein:

FIG. 1a shows an exploded view of an exemplary combination case of the present disclosure;

FIG. 1b shows a rear view of the tablet computing device of FIG. 1a;

Corresponding reference characters indicate corresponding parts throughout the several views. The exemplifications set out herein illustrate exemplary embodiments of the invention, and such exemplifications are not to be construed as limiting the scope of the invention in any manner.

DETAILED DESCRIPTION

Figure 2A:
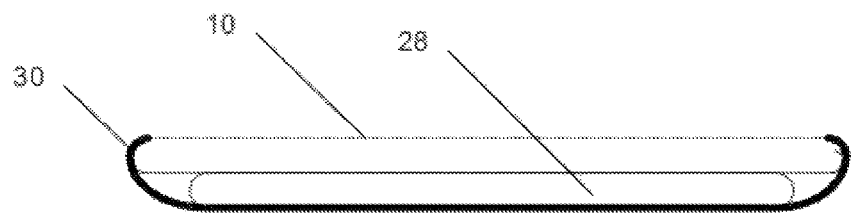
FIG. 2a shows a cross-sectional view of the case of FIG. 1 in an assembled state.

The embodiments disclosed herein are not intended to be exhaustive or to limit the disclosure to the precise forms disclosed in the following detailed description. Rather, the embodiments are chosen and described so that others skilled in the art may utilize their teachings.

Referring to FIG. 1a, an exemplary tablet computing device 10 and case 12 is shown. Tablet 10 includes touchscreen 14, shell 15, button 16, image collectors 18, audio controls 20, power button 22, and audio outputs 24 (FIG. 1b). Touchscreen 14 is an glass electronic visual display that can detect the presence and location of a touch within the display area. Shell 15 is illustratively metal and (combined with touchscreen 14) provides an outer surface of tablet 10. Button 16 is exemplary of any input device. Button 16 is illustratively used to wake device 10 as well as performing various functions depending on software present on device 10. Image collectors 18 are illustratively cameras and are located on both front (FIG. 1a) and rear (FIG. 1b) of device 10. Audio controls 20 is illustratively a button that rocks on a centrally located pivot point such that pivoting one way increases volume and pivoting the opposite way decreases volume. Embodiments are envisioned where alternate audio controls 20 are implemented such as separate and discrete buttons for increasing and decreasing volume. Audio controls 20 are further envisioned to include a mute (or vibrate) button or switch (not shown). Power button 22 is a button that activates tablet 10 from either an off or dormant state. Audio outputs 24 are located on the rear of device 10. Audio outputs 24 include internal speakers (not shown) and a plurality of apertures defined in shell 15.

Case 12 includes rigid bracket 26, thermal pad 28, and cushion sleeve 30. Rigid bracket 26 is illustratively constructed from polycarbonate. Rigid bracket 26 is sized to allow tablet 10 to snap into engagement therewith. Snap engagement allows coupling without requiring moving pieces. When attached to tablet 10, rigid bracket 26 provides a rim therearound that prevents direct engagement with edges of touchscreen 14 (or portions of shell 15 surrounding and proximate touchscreen 14). Forces applied to rigid bracket 26 such as instantaneous forces are at least partially borne and dissipated thereby to reduce forces transmitted to tablet 10 therefrom. Rigid bracket 26 further includes a transparent/translucent screen protector 32. In one embodiment, rigid bracket 26 is the bracket commercially available from Gumdrop Cases as the Drop Tech Series.

Thermal pad 28 is illustratively a cooling pad having thermally conductive outer surface 34 and cooling matter therein. The cooling matter is illustratively crystals that are solid at room temperature and that dissipate heat by absorbing heat and melting into a gel. Such cooling matter is commercially available from Thermapak as the HeatShift Technology®. Once thermal pad 28 is returned to a cooler environment, the gel re-forms into crystals. Embodiments are envisioned where the cooling matter is water (ice), refrigerant gel, or other liquid capable of being frozen and subsequently absorbing heat. In such embodiments, thermal pad 28 is illustratively of the type that is placed into a freezer to be frozen prior to use. Embodiments are envisioned where thermal pad 28 contains chemicals that are mixed on demand such that an endothermic reaction is produced. Outer surface 34 illustratively holds the cooling matter such that thermal pad 28 defines a shape that is sized and shaped (such as flat) to engage shell 15 of tablet. The engagement of thermal pad 28 and shell 15 allows thermal conduction therebetween.

Cushion sleeve 30 is illustratively made of a silicone based polymer that has a "rubberized" feel to provide high friction or "grip." Cushion sleeve 30 includes back surface 36 and front surface 38 integrally formed. Cushion sleeve 30 is sized to receive thermal pad 28 and also receive tablet 10 having rigid bracket 26 coupled thereto. To receive tablet 10, front surface 38 of cushion sleeve 30 elastically deforms. To receive tablet 10, front surface 38 is stretched in that front surface 38 defines inner boundary 40 that is smaller than an outer perimeter of tablet 10. Front surface 38 of cushion sleeve 30 seals to rigid bracket 26. Case 12 thus provides a sealed environment in which very little of tablet 10 is exposed (or touchscreen 14 is exposed if screen protector 32 is not employed).

FIG. 2a shows a cross section of the assembled tablet 10 and case 12. Cushion sleeve 30 wraps around both thermal pad 28 and the outer edges of tablet 10. Cushion sleeve 30 elastically deforms to fit thermal pad 28 therein. The elastic deformation further holds thermal pad 28 in contact with the rear of tablet 10. It should be appreciated that thermal pad 28 does not possess endless cooling capacity. Accordingly, thermal pad 28 is removed as needed to allow re-charging by placing in a freezer or other environment or to replace it with a different thermal pad 28. In the embodiment of FIG. 2a, removal of thermal pad 28 is achieved by first removing cushion sleeve 30 from tablet 10. Subsequently, a replacement or recharged thermal pad 28 is placed within cushion sleeve 30 and cushion sleeve 30 is re-attached to tablet 10.

Figure 2B:
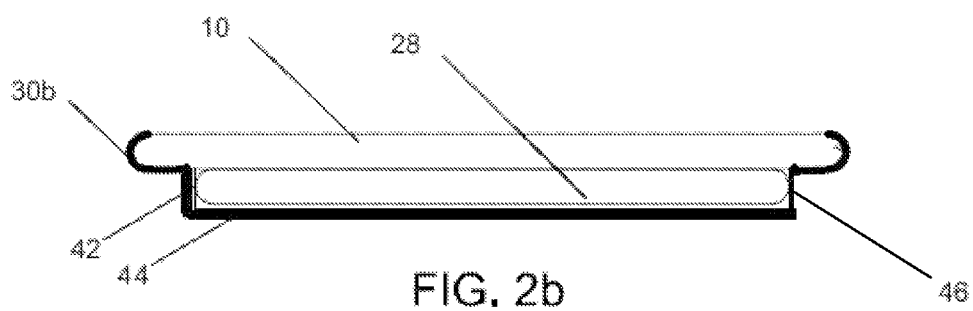
FIG. 2b shows a cross-sectional view of another embodiment case of the present disclosure.

FIG. 2b shows a cross section of a second embodiment cushion sleeve 30b. Cushion sleeve 30b includes tray 42. Tray 42 is sized to fit within pocket 44 of cushion sleeve 30b. Wall 46 of tray 42 forms a wall of cushion sleeve 30b. Wall 46 is pulled from cushion sleeve 30b to pull tray 42 out of cushion sleeve 30b. Cushion sleeve 30b or rigid bracket 26 used therewith has tracks and/or supports that hold pocket 44 open (rather than letting it elastically contract in the absence of tray 42). Thermal pad 28 is then removed from tray 42 and replaced by another thermal pad 28 (or the same pad at a later time once it has been thermally recharged).

Figure 2C:
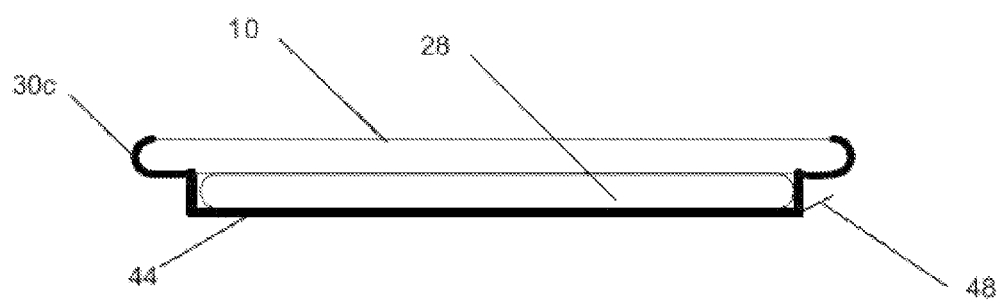
FIG. 2c shows a cross-sectional view of yet another embodiment case of the present disclosure.

FIG. 2c shows a cross section of a second embodiment cushion sleeve 30c. Cushion sleeve 30b includes door 48. Door 48 is positioned to selectively allow access to pocket 44 of cushion sleeve 30c. Door 48 forms a wall of cushion sleeve 30c. Door 48 is opened to allow removal of thermal pad 28 (or to pull tray 42) out of cushion sleeve 30b. Cushion sleeve 30c or rigid bracket 26 used therewith has tracks and/or supports that hold pocket 44 open (rather than letting it elastically contract in the absence of thermal pad 28). Thermal pad 28 is then replaced by another thermal pad 28 (or the same pad at a later time once it has been thermally recharged).

A case 12 as shown in FIGS. 1 and 2a was constructed and subjected to various environments to gauge its performance with respect to keeping tablet 10 below ambient temperature relative to other options.

Tablet 10 was placed in rigid bracket 26 and cushion sleeve 30 and then placed in 40.5° C. ambient temperature air. Tablet 10 heated up to ambient temperature after 120 minutes. Cushion sleeve 30 provides some insulation that at least partially holds generated heat within tablet 10.

Tablet 10 was placed in contact with thermal pad 28 (without rigid bracket 26 or cushion sleeve 30) and then placed in 40.5° C. ambient temperature air. Tablet 10 heated up to ambient temperature after 195 minutes.

Whereas cushion sleeve 30 operates to retain tablet heat therein, Tablet 10 was placed in rigid bracket 26 and cushion sleeve 30 with thermal pad 28 within cushion sleeve 30 and then placed in 40.5° C. ambient temperature air. The combination of rigid bracket 26, cushion sleeve 30, and thermal pad 28 provided the surprising result that tablet 10 heated up to ambient temperature after 255 minutes. Thus, whereas rigid bracket 26 and cushion sleeve 30 operate to partially retain heat generated by tablet 10, the combination of rigid bracket 26, cushion sleeve 30, and thermal pad 28 operates to enhance the cooling properties applied to tablet 10 compared to the application of thermal pad 28 alone.

Figure 3:
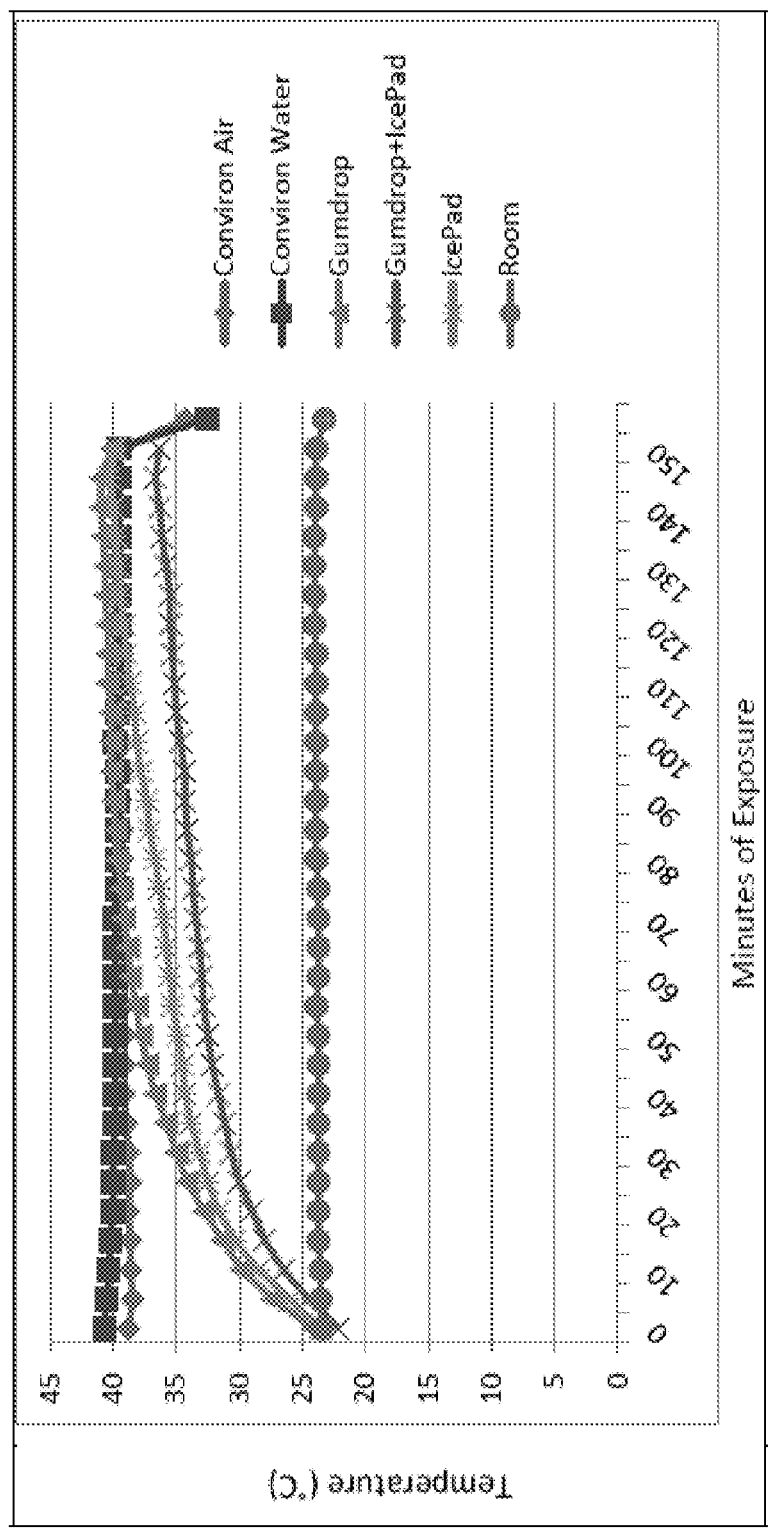
FIGS. 3 and 4 are graphs of temperatures as a function of exposure time for a plurality of provisioned tablet devices.

These surprising results were found during repeated tests of iPads in different cases in a high temperature environment. In a first trial, three iPads were taken from a control environment and exposed to a chamber environment having an air temperature of 40.5° C. (104.9° F.) for two hours and 30 minutes. The environment had a water bath at the bottom of the chamber that was held at a temperature of 42.6° C. (108.7° F.). A fourth iPad was left in the control environment that had an average temperature of 23.8° C. (74.8° F.). The temperature of each of the iPads was monitored by sensors attached to the backs thereof. FIG. 3 shows the temperatures over time for the air temperature (Conviron Air), Temperature of the water bath (Conviron Water), iPad 1 that was placed within the Gumdrop case only (Gumdrop), iPad 2 that was placed in contact with the IcePad only (icePad), iPad 3 that was placed in the combination case 12 (Gumdrop+IcePad), and iPad 4 that was located in the control environment (Room).

With the starting differential in temperature between the iPads and the test environment air of approximately 16.7° C., the temperature of the first iPad raised to the elevated room temperature after approximately 75 minutes. The temperature of the second iPad raised to the elevated room temperature after approximately 145 minutes. The temperature of the third iPad remained 5° C. below the temperature of the chamber at the end of the 150 minute test.

Similar tests were performed to measure temperature acclimation over longer periods. Again, four iPads were used with the varying locations and cases described with respect to FIG. 3. The results are shown in FIG. 4.

Figure 4:
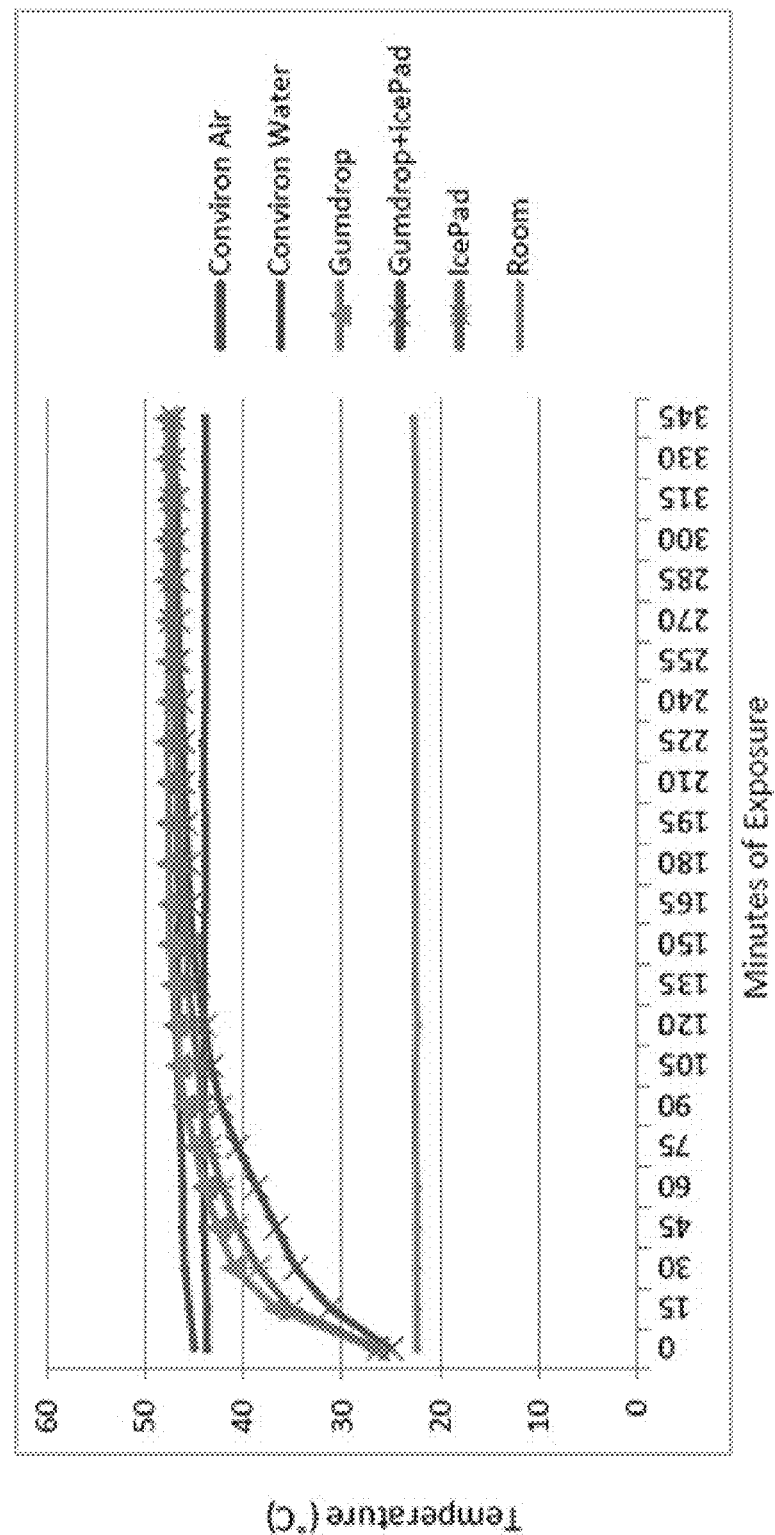

As shown in FIG. 4, the average air temperature in the test environment was 46° C. (114.8° F.). The water bath was held at an average temperature of 43.9° C. (111.2° F.). The control environment was held at an average temperature of 22.5° C. (72.5° F.). IPad #1 reached ambient temperature after 120 minutes of exposure. IPad #2 reached ambient temperature after 195 minutes of exposure. IPad #3 did not reach ambient temperature until 255 minutes of exposure.

While the above disclosure discusses use of cases with tablet computing devices, the disclosure is not intended to be restricted to such use. Indeed, the concepts described herein are intended to be applied to computing devices generally, including, but not limited to, phones and laptop computers.

While this invention has been described as having preferred designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this disclosure pertains and which fall within the limits of the appended claims.

The invention claimed is:

1. A case for an electronic device including:
   a sleeve sized and shaped to engage a housing of an electronic device,
   a bracket sized and shaped to engage the housing of the electronic device and to engage the sleeve; and
   a thermal pad sized and shaped to fit within the sleeve such that the thermal pad is held in direct contact with the electronic device when the electronic device is held within the sleeve, the sleeve including a tray therein that is sized and shaped to hold the thermal pad therein.

2. The case of claim 1, wherein the sleeve is constructed of a material that elastically deforms.

3. The case of claim 1, wherein the sleeve is constructed of a silicone containing material.

4. The case of claim 1, wherein the sleeve is constructed from a material that elastically deforms to create a pocket to receive the thermal pad therein.

5. The case of claim 1, wherein the bracket is sized and shaped such that the electronic device snaps into engagement with the electronic device without the aid of moving pieces.

6. The case of claim 1, wherein a wall of the tray forms part of an external wall of the sleeve.

7. The case of claim 6, wherein the wall and tray are sized and shaped to permit placement and withdrawal of the thermal pad from the sleeve while the electronic device is disposed therein.

8. The case of claim 1, wherein the sleeve includes a door thereon.

9. The case of claim 8, wherein the door is hinged relative to the sleeve.

10. The case of claim 8, wherein the door is sized and shaped to permit placement and withdrawal of the thermal pad from the sleeve while the electronic device is disposed therein.

11. The case of claim 1, wherein the bracket is constructed from polycarbonate and engages the electronic device such that a first force applied to the bracket is at least partially absorbed thereby such that any resulting force transmitted to the electronic device is less than the first force.

12. The case of claim 1, wherein the thermal pad includes chemicals therein that when mixed impart heat counteracting properties to the thermal pad.

13. The case of claim 1, wherein the thermal pad is sized and shaped to allow placement within the sleeve via a door defined in the sleeve.

14. A case for an electronic device including:
   a bracket sized and shaped to engage a housing of the electronic device, the bracket covering perimeter edges thereof;
   a silicone containing sleeve sized and shaped to engage the housing of an electronic device, the sleeve including a rim operable to sealingly engage one or more of the electronic device and the bracket, the sleeve having a pocket that is formed by molding or elastically deforming material of the sleeve; and
   a thermal pad sized and shaped to fit within the pocket of the sleeve such that the thermal pad is held in direct contact with the electronic device, the pocket of the sleeve including a tray therein sized and shaped to hold the thermal pad therein.

15. The case of claim 14, wherein the tray is operable to allow removal of the thermal pad from the pocket while the electronic device is within the sleeve.

16. The case of claim 14, wherein the sleeve contains a door located to selectively allow access to the pocket while the electronic device is within the sleeve.

* * * * *